United States Patent [19]
Stribling et al.

[11] Patent Number: 5,144,260
[45] Date of Patent: Sep. 1, 1992

[54] METHOD AND APPARATUS FOR PERTURBATION CANCELLATION OF A PHASE LOCKED OSCILLATOR

[75] Inventors: Bradley C. Stribling, Danville; Roger J. O. Eline, Los Gatos, both of Calif.

[73] Assignee: Rose Communications, Inc., Santa Clara, Calif.

[21] Appl. No.: 765,435

[22] Filed: Sep. 25, 1991

[51] Int. Cl.$^5$ .............................................. H03L 7/16
[52] U.S. Cl. ...................................... 331/10; 331/17; 331/23; 455/76; 455/87; 455/260
[58] Field of Search ...................... 331/10, 15, 16, 17, 331/18, 23, 25; 455/75, 76, 84, 85, 86, 87, 260

[56] References Cited
U.S. PATENT DOCUMENTS 4,107,624 8/1978 Turner ............................... 331/23 X Primary Examiner—David Mis
Attorney, Agent, or Firm—Blakely, Sokoloff, Taylor & Zafman

[57] ABSTRACT

A phase locked loop is augmented by an additional mechanism which permits the closed loop cancellation of the frequency perturbing effects on the oscillator by repetitive signals well beyond the bandwidth of the phase locked loop. Successful implementation requires that the perturbations be repetitive and that the perturbing signal be available as a reference, conditions which are commonly the case. This compound loop can effectively cancel perturbations whose dynamics change only slowly compared to the speed of the added synchronous loop. The Anti-Pulling Loop mechanism consists of an amplifier to increase the level of the evidence of the perturbations present at the phase detector's output, a synchronous amplitude detector to correlate the perturbations with a reference signal, a circuit for the generation of a suitable quadrature reference signal, a loop integrator for the control of a signal injection mechanism, and a signal injection circuit to supply an appropriate signal to oppose and cancel the effects of the perturbing signal.

18 Claims, 6 Drawing Sheets

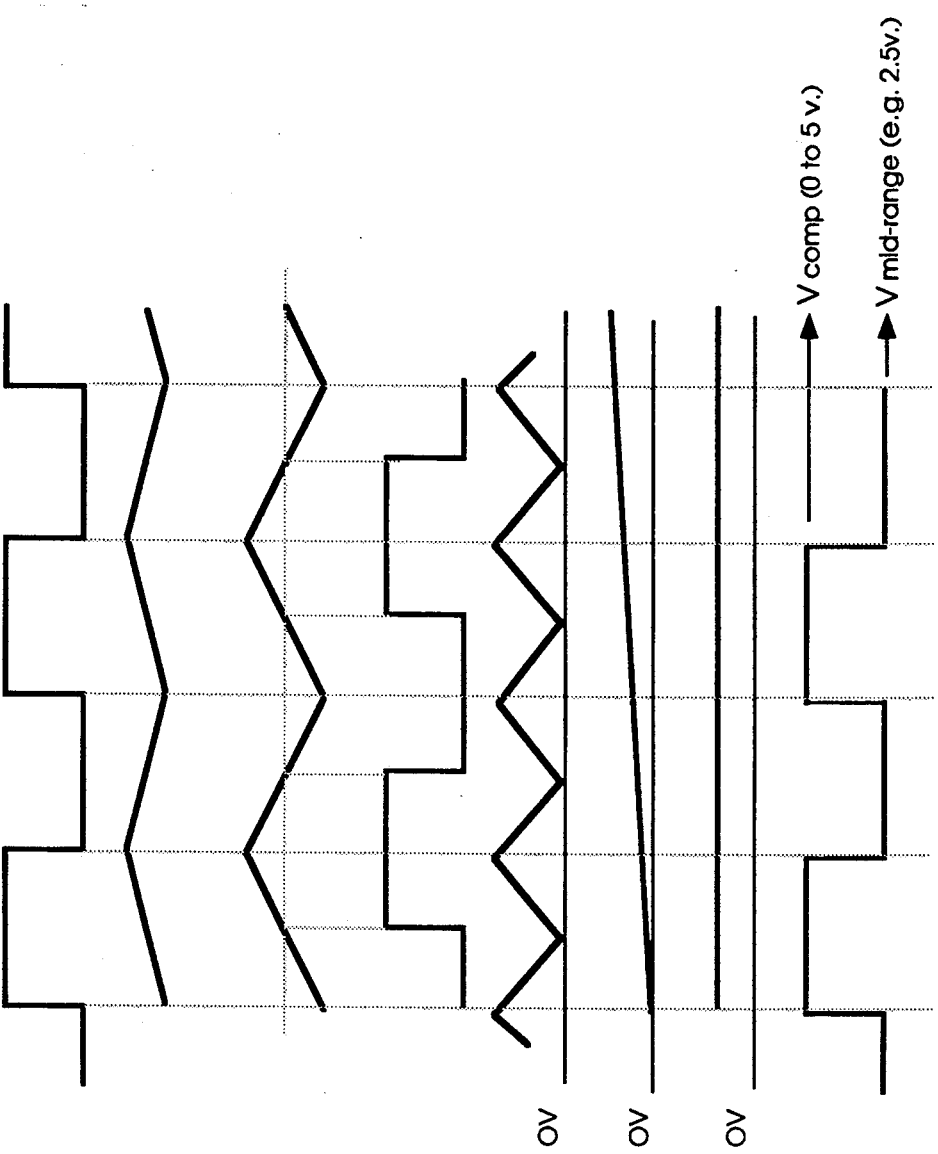

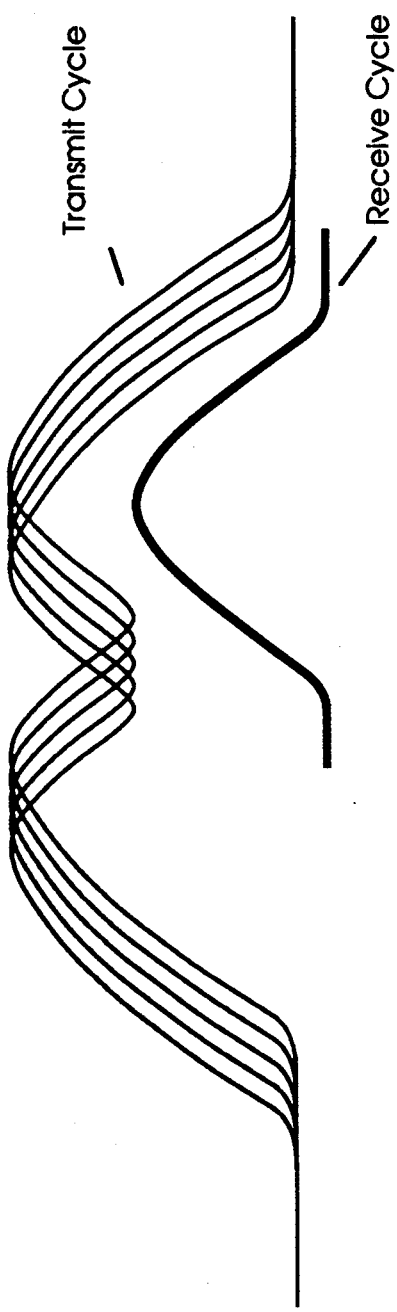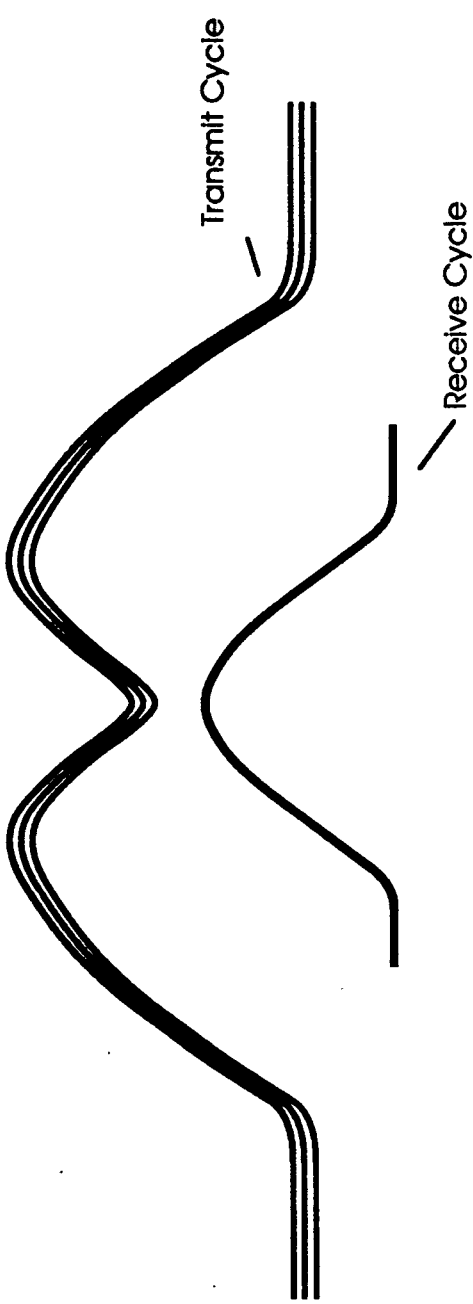

METHOD AND APPARATUS FOR PERTURBATION CANCELLATION OF A PHASE LOCKED OSCILLATOR

BACKGROUND OF THE INVENTION

1. Field of the Invention

The present invention relates to the elimination of various forms of frequency perturbations of a phase locked oscillator. More particularly, the present invention relates to the use of a synchronous demodulator to determine the correlation between undesired frequency fluctuations of a phase locked oscillator and the perturbation signal itself, and the consequent generation of a control signal to cancel such undesired perturbations in a closed loop manner.

2. Art Background

This invention relates to the problem of stabilizing the frequency of a phase locked oscillator which is in the presence of various influences which tend to alter the operating frequency of the oscillator. There are many situations where this condition occurs, but a common example arises with Transmit/Receive Keying in a communication system. FIG. 1 is a block diagram depicting such a system. A synthesized frequency is derived from the phase locked oscillator comprising a phase detector 1, loop amplifier 2, loop divider 3, and voltage controlled oscillator 4, and is used as the excitation for the transmitter 5. Such signal may, in some applications, be used as part of the receiver circuitry 6. Many communication systems alternate between Transmit and Receive modes (called "T/R Keying") at a periodic and rapid rate.

If properly designed, having phase locked the oscillator in such a system provides assurance that the center frequency of operation does not vary. However, a problem arises in the presence of perturbing influences of a high frequency nature. Specifically, the phase locked loop which stabilizes the oscillator can not eliminate frequency fluctuations arising from components of the perturbing influences which are well above the bandwidth of the phase locked loop. FIG. 2 is a block diagram depicting this condition. The resulting fluctuations are unabated by the phase locked loop and appear as variations or errors in the transmitted frequency. In systems employing the same oscillator in the receiver circuitry, variations and errors occur in the nominal receive frequency.

The perturbing influences in the application described above can be many, but generally include "Power Supply Pushing", "Load Pulling", and "Injection Pulling." The action of applying or removing the excitation from the transmit path 7 can alter the current demands in the power supply, slightly altering its voltage, and the intrinsic frequency sensitivity of the oscillator to the power supply voltage gives rise to "Power Supply Pushing." This can generally be mitigated by improved supply bypassing and filtering. The other two phenomena are more onerous. In general, some form of switch is used to remove or apply the excitation signal from the transmit path, and that action may present a slight impedance variation to the output of the oscillator. Depending upon the magnitude and phase angle of the impedance variation, the frequency of the oscillator may shift considerably ("Load Pulling"). Additionally, if there are signal paths whereby the intermittent signal from the transmit antenna can reach the oscillator itself , again depending on the magnitude and phase angle of the signal reaching the oscillator, the frequency of operation may shift considerably ("Signal Injection Pulling"). FIG. 3 depicts typical frequency pulling phenomena of this nature. Mitigation of these two phenomena generally requires extensive shielding, buffering, harmonic multipliers, etc., and it is often difficult and expensive to achieve sufficient containment. Accordingly, in situations such as the example just described, where T/R Keying (or other perturbation) occurs at a rate substantially above the bandwidth of the phase locked loop, the oscillator frequency fluctuations are very problematic.

As will be described below in more detail, a novel and simple solution to the above problems is provided by a key alteration to the above described standard circuitry.

SUMMARY OF THE INVENTION

A phase locked loop is modified by the addition of a mechanism which will be herein referred to as an "Anti-Pulling Loop." It is through the action of this Anti-Pulling Loop that perturbations (sometimes referred to as "pulling" in the following text) which are not reduced by the phase locked loop, owing to their high-frequency nature, may be effectively eliminated.

The Anti-Pulling Loop of the present invention comprises an amplifier connected to the phase detection of the phase locked loop, a synchronous amplitude detector, a reference signal generator, an integrator, and a controllable compensation signal generator which injects a correction signal into the phase locked loop's voltage-controlled oscillator (VCO). Therefore, a composite loop consisting of the phase locked loop and the anti-pulling loop of the present invention is able to stabilize the oscillator against arbitrary or random perturbations below the loop bandwidth and periodic or synchronous perturbations well above the loop bandwidth.

BRIEF DESCRIPTION OF THE DRAWINGS

The objects, features and advantages of the present invention will be apparent from the following detailed description in which:

FIG. 5 diagrams typical waveforms present at various points in the Anti-Pulling Loop of the present invention.

FIG. 6 depicts the spectrum of transmission signals in a phase locked loop subjected to undesired pulling.

FIG. 7 depicts the spectrum of transmission signals in a phase locked loop wherein pulling is eliminated.

DETAILED DESCRIPTION OF THE INVENTION

Figure 1:
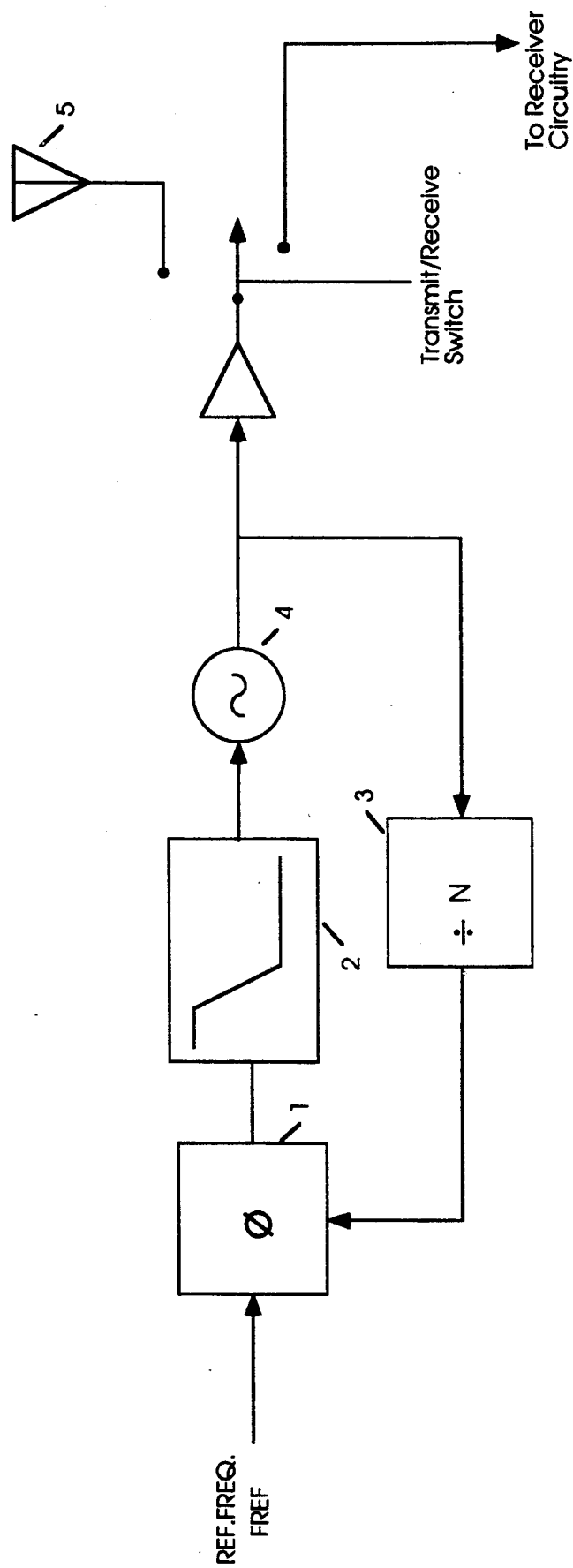
FIG. 1 illustrates a prior art application of a phase locked oscillator in a communication system. In this configuration, a synthesized-frequency phase locked voltage controlled oscillator is used to provide the transmit signal and may be used in part of the receiver circuitry.
Figure 2:
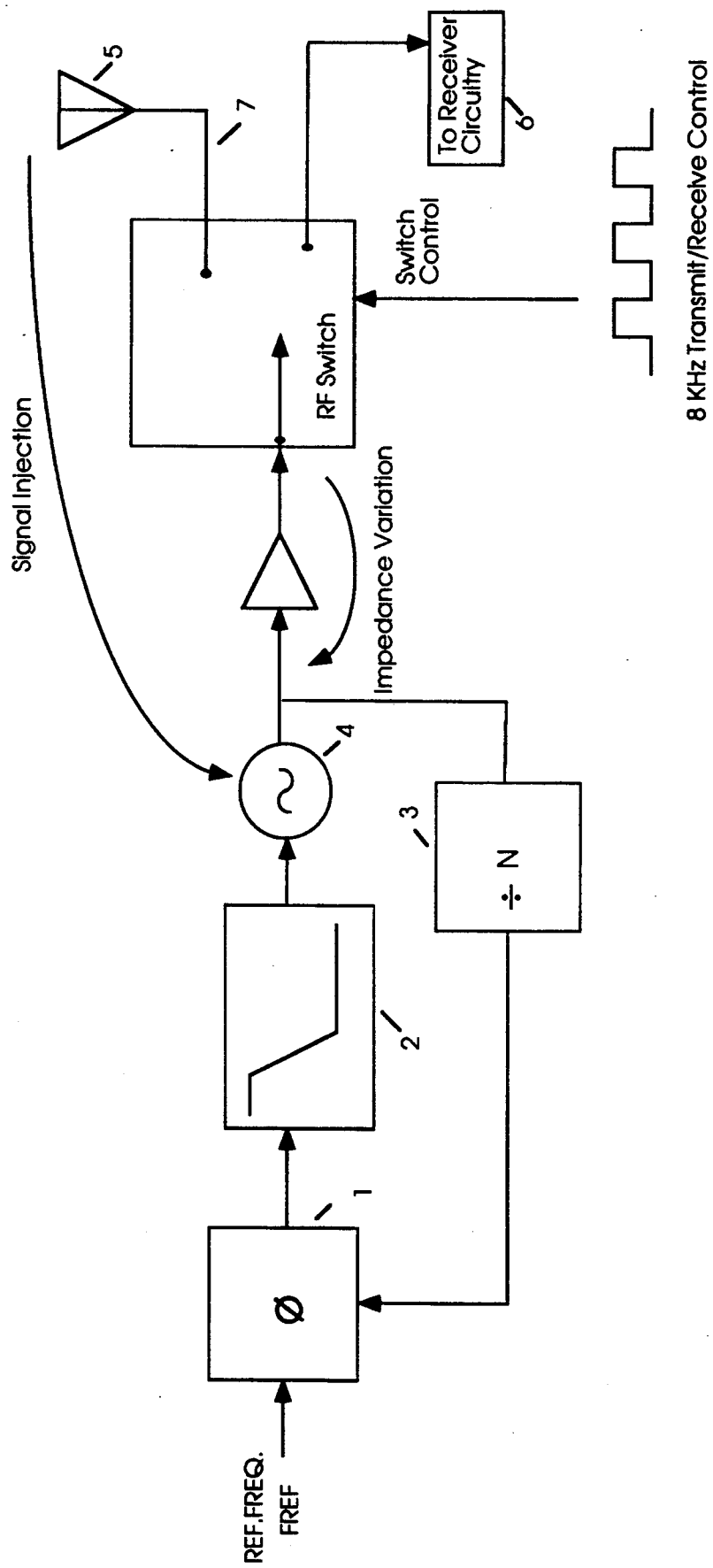
FIG. 2 illustrates the perturbing influence of Transmit/Receive Keying (as an example) in a prior art system.
Figure 3:
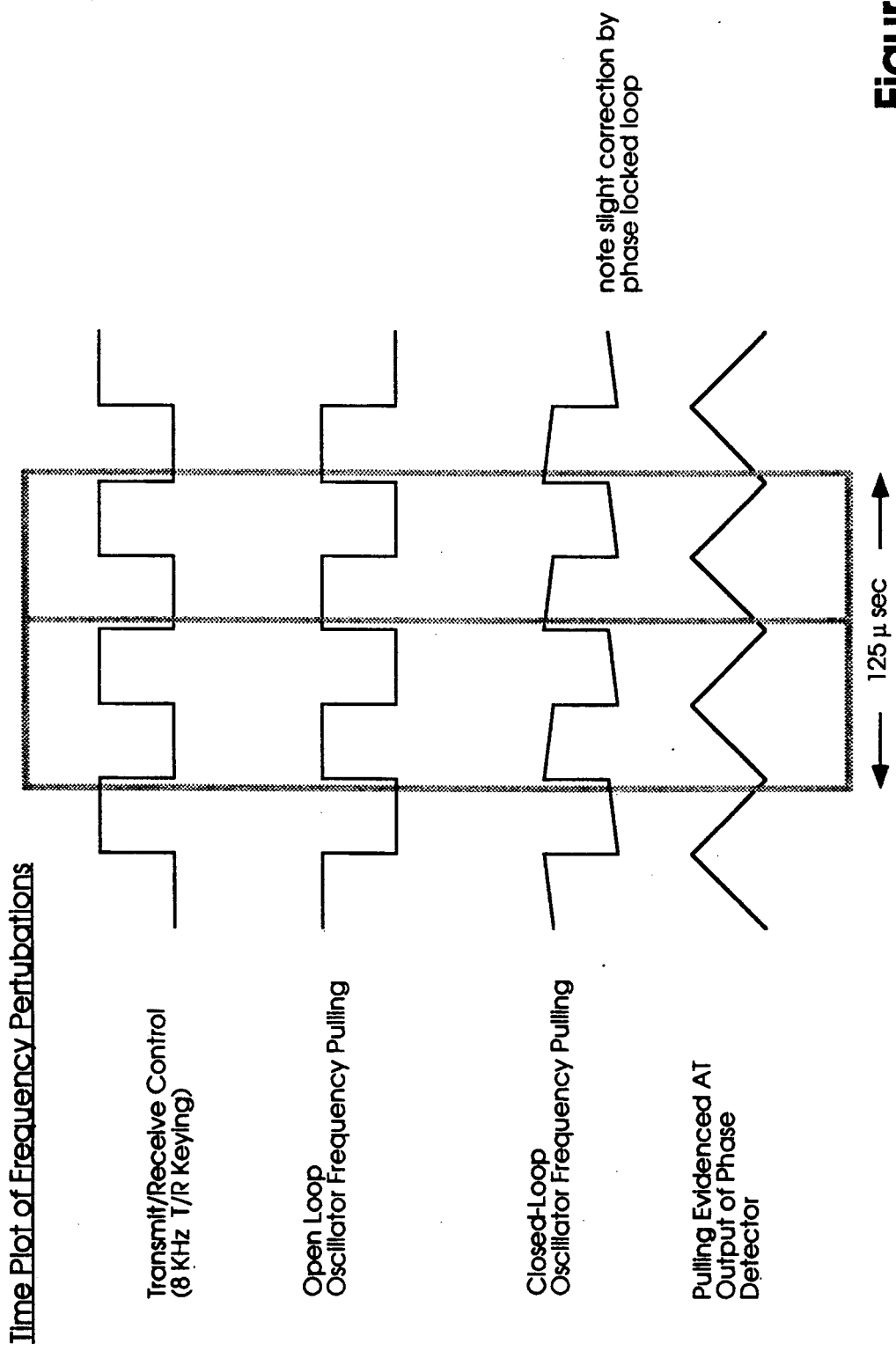
FIG. 3 diagrams typical waveforms which relates the Transmit/Receive Keying signal to the pulling effects.

A means for eliminating deleterious frequency perturbations of a phase locked oscillator is disclosed. In the following description, for purposes of explanation, specific numbers, times, signals, signal timing, architectures, etc. are set forth in order to provide a thorough understanding of the present invention. However, it will be apparent to one skilled in the art that the present invention may be practiced without these specific details. In other instances, well known circuits and devices are shown in block diagram form in order not to obscure the present invention unnecessarily.

In the mechanism of the present invention, referred to as the Anti-Pulling Loop, a means is provided to synchronously detect evidence of uncorrected pulling present at the phase detector's output. The pulling is the result of perturbations arising from the action of the Transmit/Receive Control.

It is assumeed in the following description, for purposes of illustration, that the perturbations are derived from T/R Keying (Transmit/Receive mode Keying in a communication system), although the application of the present invention is not limited as such. Further for purposes of illustration, the T/R Keying Control signal is a square wave, although the proper functioning of this invention does not require such 50% duty cycle nor even that the perturbations be a rectangular pulse train.

A synchronous amplitude detector compares a first input 30, representing signals present at the phase detector's 45 output with a second input 35 representing a reference signal derived from the signal causing the pulling. The D.C. average of the output signal 40 of this synchronous amplitude detector 25 is an indication of the correlation between the two signals input to that detector. Therefore, pulling evidence present on the phase detector's 45 output (which is, of course, correlated with the signal causing the pulling) may be sensed as to its magnitude and polarity (relative to the pulling signal itself). Thus, the correlator comprising the synchronous amplitude detector and its related signals may be placed in control of a correction signal generator to achieve closed-loop correction of the pulling. Other fluctuations present on the phase detector's 45 output, which are not correlated with the cause of the pulling, do not generate a D.C. result from the correlator's output and therefore will not influence the correction mechanism.

It is important to note that the signal present at the phase detector's output which evidences frequency fluctuations of the oscillator is, mathematically, the integral of the pulling signal. This implies, in the time domain, a modified shape of the signal, and in the frequency domain, a 90 degrees phase shift along with a 1/f amplitude rolloff. For example, if the pulling signal (and the frequency fluctuation) is a square wave (as derived from T/R Keying), the frequency pulling will be evidenced at the phase detector's output as a triangle wave. This is because a step change in frequency results in a continuous ramping change in phase angle. Consequently, the evidence signal is shifted 90 degrees from the pulling signal. In the case of square wave pulling, the evidence signal is a triangle wave with its peaks occurring at the transitions of the pulling square wave.

Therefore, the reference signal 10 input to the synchronous amplitude detector 25 needs to be shifted similarly. For example, if the pulling signal is a square wave, the reference signal to the synchronous detector should be a square wave in quadrature with the pulling signal. In so doing, the output 40 of the synchronous amplitude detector will appear as follows: one polarity of the triangle wave's excursions will be inverted and aligned with the opposite polarity. It will thus resemble a triangle wave of twice the original frequency, whose amplitude is proportional to that of the input triangle wave, and whose polarity with respect to zero depends on the phase relationship with the reference signal. In short, when this signal is low-pass filtered, the resulting average D.C. voltage will reflect the magnitude and polarity of the residual uncorrected pulling with respect to the pulling signal.

The evidence signal presented to the synchronous amplitude detector may exhibit some phase shift. This may arise from the signal amplifier itself or also from the filter network connected to the phase detector. In order to maximize the effectiveness of the anti-pulling loop, the amplified signal needs to be in alignment with the quadrature reference signal (or a lowered loop gain may result). While it is preferred to keep such phase shifts low, a modest amount (10 degrees, or so) may be accommodated by imposing an identical additional shift to the quadrature reference signal.

Preferably the synchronous amplitude detector 25 is the form of a balanced mixer, wherein the reference signal input port 35 is often called the L.O. ("local oscillator") port. It is to be expected that some leakage exists from the reference signal to the output of the detector. This is an A.C. signal and will not, in itself, cause an offset error in the cancellation mechanism. It may, however, impact some modulation of its own to the output frequency, and so some filtering of the synchronous detector's output to eliminate this leakage (perhaps only by the loop integrator itself) is desirable.

The average D.C. voltage output amplitude detector 25 is used to control the injection of an appropriate cancellation signal to the voltage controlled oscillator 50. The output 40 of the amplitude detector 25 is first processed by an integrator 55 which is part of the closed loop mechanism. The action of the integrator 55 is to ramp its output in either direction sufficiently to cause the signal injection mechanism to supply just the exact compensating signal such that the residual uncompensated pulling is eliminated, thus causing the input to the integrator 55 to be driven to zero. At such a condition the residual pulling is reduced to zero and the closed loop process is in a steady state.

The Anti-Pulling Loop generates the cancellation signal to determine the detrimental effects of the perturbing signal. This can be achieved by a variety of electronic means.

Preferably this is achieved by an analog switch 60 receives two analog input signals and outputs one analog signal according to a digital control signal input. An example of an analog switch is the MC14016 Quad Analog switch manufactured by Motorola Corporation. The first input to the analog switch is coupled to receive the signal output by the integrator. The second input is coupled to receive a predetermined signal of value indicative of an open circuit. In the preferred embodiment this value is equivalent to the mid point value of the range of values ($V_{mid}$) at 2.5 volts. This shifts the threshold value by +2.5 volts thereby shifting the range of values of cancellation signals to be generated into the positive range and eliminating the generation of negative signals.

The control input to analog switch 60 controls which input signal is output by the analog switch 60. In the preferred embodiment, the output signal will vary in signal level to pull/push the controlled oscillator at transition to eliminate the effects of the perturbations.

Preferably the Anti-Pulling Loop provides the cancellation signals at transition points of the signal causing the perturbations, in the present instance, the Transmit/-Receive Control 10, to be cancelled.

Using this signal to be added in with the phase lock loop control signal to control the voltage controlled oscillator 50 (FIG. 4) the negative effects caused by the T/R control are mitigated.

In the preferred embodiment the perturbing signal is a rectangular pulse train, although the present invention is not limited as such. Preferably, the perturbation signal can be used to switch or gate analog levels by analog switch 60 derived from the integrator 55 (FIG. 4) and in so doing create a rectangular pulse train of controllable arbitary magnitude and polarity relationship with the perturbing signal. The cancellation signal is applied to the oscillator's 50 tuning control input so as to influence the operating frequency in exact opposition to the perturbing signal. The cancellation signal output by compensation generator 60 is summed with the phase locked loop signal signal by summing circuit 65 and input to the control input of oscillator 50. It should be noted that the D.C. average of the summed signal is largely irrelevant as the inherent action of the phase locked loop will cancel any effect of this average.

The Anti-Pulling Loop of the present invention is a feedstock loop and as such possesses its own control dynamics, such as bandwidth, response time, overshoot, etc. These are established through normal design considerations and will govern the manner in which the Anti-Pulling Loop will respond to changes in the relationship between the perturbing signal and its deleterious effects on the oscillator. Typically, these derive from temperature and proximity effects, etc., and are relatively slowly varying in effect. Accordingly an Anti-Pulling Loop with a modest operational bandwidth (e.g., a few hundred Hertz) is preferred.

In practice, the output of the synchronous amplitude detector 25 (FIG. 4) and the input of the integrator 55 (FIG. 4), may be expected to exhibit some small D.C. offset voltage. To the extent that this offset voltage is not adjusted to zero, such an offset represents a residual error in the compensated pulling. To address this, low-offset devices can be selected for the amplifier 22, the synchronous amplitude detector 25, and the integrator 55, and sufficient A.C. gain may be input preceding the correlator. In this manner, the equivalent "input-referred magnitude" of the D.C. offset may be rendered sufficiently small to not effect the operation of the anti-pulling loop of the present invention.

Figure 4:
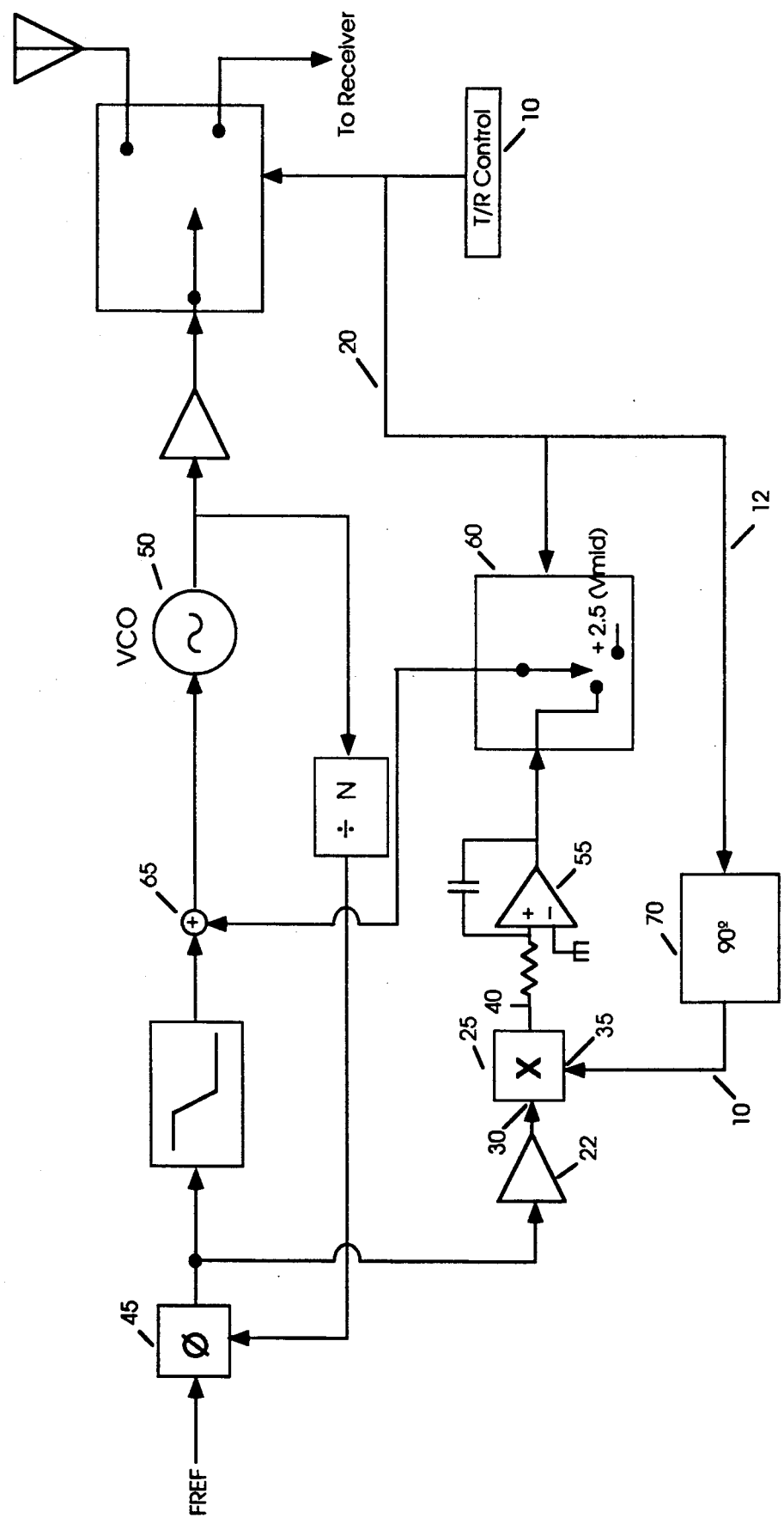
FIG. 4 depicts a block diagram of the preferred embodiment elements of the invention.

FIG. 5 illustrates the signal waveforms which exist at various points along the perturbation cancellation circuit of the present invention (illustrated by FIG. 4). The source of the perturbations is illustrated by waveform 101. This is caused by the T/R control 10. This is the input to the quadrature reference generator 70 which generates a phase shifted reference signal illustrated by waveform 104. The signal representing pulling evidence from the phase detector is represented by waveform 102. This amplified by amplifier 22 to generate the signal represented by the waveform of 103 which is input to the synchronous amplitude detector 25 along with the quadrature reference signal output by the quadrature reference generator 70. The output of the synchronous amplitude detector 25 in the present example would be the waveform 105 wherein the height of the signal is dependent upon the magnitude and direction of the pulling signal. The signal represented by 106 is the output of integrator 55 showing the residual uncorrected pulling. The signal shows that the voltage slews towards a steady state value. Steady state value is illustrated in the waveform 107 wherein the voltage level equals the control value for effective cancellation. Therefore, the compensation generator generates a signal illustrated by the waveform 108 when in steady state wherein the excursions between $V_{comp}$ and $V_{mid\text{-}range}$ possess the correct amplitude and polarity to oppose to perturbations.

A graphic portrayal of the functioning of the Anti-Pulling Loop of the present invention is provided by FIG. 6 and FIG. 7. These figures are representative of a spectrum analyzer display. FIG. 6 represents the spectrum of the actual transmitted signal of a phase locked system which is subject to undesired pulling by the Transmit-Receive alternation. The graph appears similar to an overlay of two traces, but is actually displaying spectrum during the receive cycle as well as spectrum during the transmit cycle. Three key observations can be made: a) the signal level is lower during the receive cycle due to the RF switch performing the T/R Keying; b) the higher signal during the transmit cycle is rather spread due to the presence of binary frequency modulation; and c) there is a significant frequency skew between transmit and receive cycles. This skew arises from back-and-forth pulling of the frequency in synchronism with the T/R Keying, and varies considerably in direction and magnitude over time, frequency, etc.

FIG. 7 depicts the same conditions as FIG. 6, but with the Anti-Pulling Loop of the present invention activated. The close relative centering of the transmit and receive signal spectra reveals the successful elimination of pulling.

The foregoing has described a closed loop mechanism for the cancellation of frequency perturbations of a phase locked loop. It is contemplated that changes and modifications may be made by one of ordinary skill in the art, to the materials and arrangements of elements of the present invention without departing from the spirit and scope of the invention.

We claim:

1. An anti-pulling loop mechanism for the cancellation of deleterious perturbations caused by a perturbating signal to the frequency of a phase locked oscillator, said phase locked oscillator comprising a controlled oscillator which generates an oscillating signal output in accordance with a control signal input, a phase detector to detect the difference between a reference signal and the oscillating signal output, the control signal input generated by a control signal means and dependent upon the difference detected by the phase detector, said anti-pulling loop mechanism comprising:

an amplifier means coupled to receive the output phase detector of the phase locked oscillator to extract and amplify the signal present at the phase detector's output which evidences the perturbations prior to input to the synchronous amplitude detector;

a reference signal generated from the perturbating signal;

a synchronous amplitude detector coupled to receive the output of the amplifier and the reference signal to determine the magnitude and polarity of the amplified signal with reference to the reference signal;

a controllable signal injection circuit to supply a cancellation signal to the control signal input of the oscillator;

an integrator circuit coupled to receive the output of the synchronous amplitude detector and to generate a signal to control the signal injection circuit, said integrator circuit establishing a steady state operating point at the minimum perturbation;

a combining means coupled to receive the cancellation signal and the control signal of the phase locked oscillator to generate a combined signal of the cancellation signal and the control signal output to the oscillator;

whereby the oscillator is controlled minimizing errors caused deleterious perturbations.

2. The mechanism as set forth is claim 1, wherein the reference signal is in quadrature with the perturbing signal.

3. The mechanism as set forth in claim 2, wherein the reference signal is placed in quadrature with the perturbing signal by a phase shift means which shifts the perturbing signal by 90 degrees.

4. The mechanism as set forth in claim 1, wherein the signal injection circuit comprises an analog switch having as a first input the signal output by the integrator circuit, having as a second input a predetermined mid-range voltage, and a central input to control the output to be the first input or the second input.

5. The mechanism as set forth in claim 1, wherein the combining means comprises an adder circuit.

6. The mechanism as set forth claim 1, wherein the integrator circuit comprises an integrator the output of which is ramped from an initial state to cause the signal injection circuit to supply a cancellation signal such that the input to the integrator is driven to a zero and the output is maintained at a steady state.

7. The mechanism as set forth in claim 1, wherein the perturbating signal is a synchronous square wave signal.

8. The mechanism as set forth in claim 1, wherein the phase locked oscillator is part of a communication system having a transmit mode and receive mode and the perturbating signals are caused by a Transmit/Receive switch which switches between transmit and received modes.

9. The mechanism set forth in claim 8, wherein the signal injection circuit comprises an analog switch having as a first input the signal output by the integrator circuit, having a second input a predetermined mid-range voltage, and a control input coupled to receive the output of the Transmit/Receive switch.

10. A communication system comprising a receive mode and a transmit mode for respectively receiving and transmitting signals, said communication system switching between transmit and receive modes in accordance with a Transmit/Receive Control signal generated by a Transmit/Receive switch, said communication system comprising a phase locked oscillator which generates an output oscillating signal utilized in the receive mode and the transmit mode, an anti-pulling loop mechanism for the cancellation of deleterious perturbations caused by a perturbating signal to the frequency of a phase locked oscillator, said phase locked oscillator comprising a controlled oscillator which generates an oscillating signal output in accordance with a control signal input, a phase detector to detect the difference between a reference signal and the oscillating signal output, the control signal input generated by a control signal means and dependent upon the difference detected by the phase detector, said anti-pulling loop mechanism comprising:

a reference signal generated from the perturbating signal;

an amplifier means coupled to receive the output of the phase detector of the phase locked oscillator to extract and amplify the signal present at the phase detector's output which evidences the perturbations prior to input to the synchronous amplitude detector;

a synchronous amplitude detector coupled to receive the output of the amplifier and the reference signal to determine the magnitude and polarity of the amplified signal with reference to the reference signal;

a controllable signal injection circuit to supply a cancellation signal to the control signal input of the oscillator;

an integrator circuit coupled to receive the output of the synchronous amplitude detector and to generate a signal to control the signal injection circuit, said integrator circuit establishing a steady state operating point at the minimum perturbation;

a combining means coupled to receive the cancellation signal and the control signal of the phase locked oscillator to generate a combined signal of the cancellation signal and the control signal output to the oscillator;

whereby the oscillator is controlled minimizing errors caused by deleterious perturbations.

11. The mechanism as set forth is claim 10, wherein the reference signal is in quadrature with the perturbing signal.

12. The mechanism as set forth in claim 11, wherein the reference signal is placed in quadrature with the perturbing signal by a phase shift means which shifts the perturbing signal by 90 degrees.

13. The mechanism as set forth in claim 10, wherein the signal injection circuit comprises an analog switch having as a first input the signal output by the integrator circuit, having as a second input a predetermined mid-range voltage, and a central input to control the output to be the first input as a second input.

14. The mechanism as set forth in claim 10, wherein the combining means comprises an adder circuit.

15. The mechanism as set forth in claim 10, wherein the integrator circuit comprises an integrator the output of which is ramped from an initial state to cause the signal injection circuit to supply a cancellation signal such that the input to the integrator is driven to a zero and the output is maintained at a steady state.

16. The mechanism as set forth in claim 10, wherein the perturbating signal is a synchronous square wave signal.

17. The mechanism as set forth in claim 10, wherein the perturbating signals are caused by the Transmit/Receive switch.

18. In a communications system comprising a receive mode and a transmit mode to respectively receive and transmit signals, said communications system switching between transmit and receive modes in accordance with a Transmit/Receive control signal generated by Transmit/Receive switch, said communications system comprising a phase locked oscillator which generates an output oscillating signal utilized in the receive mode and the transmit mode, said phase locked oscillator comprising a control oscillator which generates an oscillating signal output in accordance with the control signal input, and a phase detector to detect the difference between a reference signal and the oscillating signal output, the control signal input generated by a control signal means and dependent upon the difference detected by the phase detector;

a method for the cancellation of deleterious perturbations caused by a perturbating signal to the frequency of phase locked oscillator, said method comprising the steps of:

providing a reference signal derived from the perturbating signal;

amplifying the signal output by the phase detector of the phase locked oscillator, said signal evidence the perturbations prior to input to the synchronous amplitude detector;

synchronously detecting the magnitude and polarity of the amplified signal with reference to the reference signal to generate an amplitude detected signal;

integrating the amplitude detected signal to generate a control signal, said step of integrating establishing a steady state operating point at minimum perturbation;

supplying a cancellation signal to the control signal input of the oscillator, said cancellation signal determined from the integrated signal;

combining the cancellation signal and the control signal of the phase locked oscillator thereby generating a combined signal output to the oscillator whereby the oscillator is controlled minimizing errors caused by deleterious perturbations.

* * * * *